US011791536B2

(12) United States Patent
Scherr et al.

(10) Patent No.: US 11,791,536 B2
(45) Date of Patent: Oct. 17, 2023

(54) TRANSMITTER COMPONENT, RECEIVER COMPONENT, TRANSCEIVER CIRCUIT, AND GATE DRIVER CIRCUIT WITH INTEGRATED ANTENNA STRUCTURE

(71) Applicant: Infineon Technologies Austria AG, Villach (AT)

(72) Inventors: Wolfgang Scherr, Villach (AT); Peter Hoffmann, Klagenfurt (AT); Marc Tiebout, Finkenstein (AT)

(73) Assignee: Infineon Technologies Austria AG, Villach (AT)

( * ) Notice: Subject to any disclaimer, the term of this patent is extended or adjusted under 35 U.S.C. 154(b) by 196 days.

(21) Appl. No.: 17/489,661

(22) Filed: Sep. 29, 2021

(65) Prior Publication Data

US 2022/0102836 A1    Mar. 31, 2022

(30) Foreign Application Priority Data

Sep. 30, 2020    (EP) .................................... 20199331

(51) Int. Cl.
*H01Q 1/22*    (2006.01)
*H01L 23/66*    (2006.01)
*H01L 23/00*    (2006.01)
*H01L 25/10*    (2006.01)
*H04B 1/10*    (2006.01)
*H04B 1/40*    (2015.01)

(52) U.S. Cl.
CPC ........... *H01Q 1/2283* (2013.01); *H01L 23/66* (2013.01); *H01L 24/48* (2013.01); *H01L 25/105* (2013.01); *H04B 1/1009* (2013.01); *H04B 1/40* (2013.01); *H01L 2223/6611* (2013.01); *H01L 2223/6677* (2013.01); *H01L 2224/48229* (2013.01); *H01L 2924/1426* (2013.01); *H01L 2924/14222* (2013.01)

(58) Field of Classification Search
CPC ....... H01Q 1/2283; H01L 23/66; H01L 24/48; H01L 25/105; H04B 1/1009
USPC ......................................................... 343/702
See application file for complete search history.

(56) References Cited

U.S. PATENT DOCUMENTS 9,219,028 B1    12/2015  Higgins et al.
2006/0028378 A1    2/2006  Gaucher et al.
(Continued)

OTHER PUBLICATIONS

Ben Elhaj Moussa, Houssemeddine, et al., "Integrated On-Chip Antenna on Silicon for Millimeter-wave Applications", https://www.researchgate.net/publication/256511812; Conference Paper, Sep. 2013, pp. 1-5.

(Continued)

*Primary Examiner* — Peguy Jean Pierre
(74) *Attorney, Agent, or Firm* — Murphy, Bilak & Homiller, PLLC

(57) ABSTRACT

A transmitter component includes an input terminal and a first semiconductor portion with doped regions of a control-side interface circuit. The control-side interface circuit converts a digital input signal received at the input terminal into a transmit radio frequency signal. A control-side metallization structure on at least one of two horizontal main surfaces of the first semiconductor portion includes at least a portion of a control-side antenna structure that emits the transmit radio frequency signal as radio wave. A transceiver circuit may include the transmitter component and a receiver component.

15 Claims, 8 Drawing Sheets

(56) References Cited

U.S. PATENT DOCUMENTS

2008/0158084 A1     7/2008   Rofougaran
2012/0190310 A1*   7/2012   Ieki .................... G06K 7/10316
                                                                               455/73

OTHER PUBLICATIONS

Ragonese, Egidio, et al., www.mdpi.com/journal/electronics; Electronics 2020, 9, 943; doi:10.3390/electronics9060943, 2020, pp. 1-17.

* cited by examiner

TRANSMITTER COMPONENT, RECEIVER COMPONENT, TRANSCEIVER CIRCUIT, AND GATE DRIVER CIRCUIT WITH INTEGRATED ANTENNA STRUCTURE

TECHNICAL FIELD

The present disclosure relates to a transmitter component with an integrated antenna structure and to a complementary receiver component with an integrated antenna structure. Further embodiments refer to a transceiver circuit and to a gate driver circuit including a transmitter component with an integrated antenna structure and a complementary receiver component with an integrated antenna structure.

BACKGROUND

Galvanic isolation separates electric circuits that may operate at different potentials and that exchange power and/or information. Galvanic isolation may be used to separate low voltage control circuits from high current drive circuits. For example, galvanic isolation may prevent voltage shifts in the low voltage control circuit due to high currents that a drive circuit induces into a shared ground conductor. Galvanic isolation may also prevent accidental current through a person's body getting into contact with a manual control element which is part of the control circuit or connected to the control circuit. Typically, transformers, capacitors or optocouplers are used to exchange power and/or information between galvanically isolated electric circuits. There is a need for reliable, space saving and cost-effective devices facilitating the transfer of information between electrically separated electric circuits.

SUMMARY

An embodiment of the present disclosure relates to a transmitter component that includes an input terminal and a first semiconductor portion with doped regions of a control-side interface circuit. The control-side interface circuit converts a digital input signal received at the input terminal into a transmit radio frequency signal. A control-side metallization structure on at least one of two horizontal main surfaces of the first semiconductor portion includes at least a portion of a control-side antenna structure that emits the transmit radio frequency signal as a radio wave.

A complementary embodiment of the present disclosure relates to a receiver component that includes an output terminal and a second semiconductor portion with doped regions of a driver-side interface circuit. The driver-side interface circuit converts a receive radio frequency signal into a driver signal output at the output terminal. A driver-side metallization structure on at least one of two horizontal main surfaces of the second semiconductor portion includes at least a portion of a driver-side antenna structure that obtains the receive radio frequency signal from a radio wave.

A transceiver circuit may include the transmitter component and the complementary receiver component Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a transmitter component, a receiver component, a transceiver circuit, and a gate driver circuit and together with the description serve to explain principles of the embodiments. Further embodiments are described in the following detailed description and the claims.

DETAILED DESCRIPTION

Figure 1:
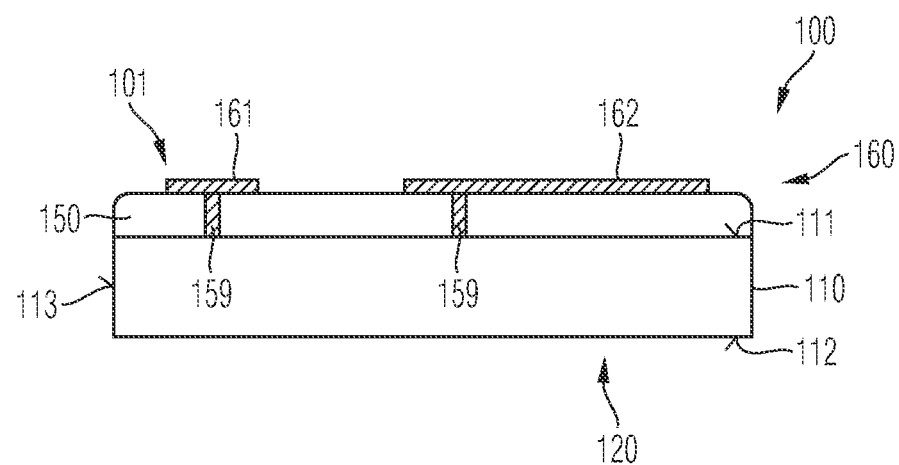
FIG. 1 is a schematic vertical cross-sectional view of a transmitter component with an on-chip antenna structure according to an embodiment.

In the following detailed description, reference is made to the accompanying drawings, which form a part hereof and in which are shown by way of illustrations specific embodiments in which a transmitter component, a receiver component, a transceiver circuit, and a gate driver circuit may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An embodiment refers to a transmitter component that may include an input terminal, a first semiconductor portion and a control-side metallization structure. The transmitter component may be monolithically integrated together with at least one further component, may share a common package with at least one further component, or may be an individually packaged solid-state semiconductor device.

The transmitter component may include at least one input terminal. For example, the transmitter component may include one single input terminal and receives an input signal between the input terminal and a first reference voltage terminal to which a first reference voltage is applied. The first reference voltage may be a negative control-side voltage supply. According to another example, the transmitter component may include two input terminals and receives the input signal as differential signal between the two input terminals. The input signal may be a digital signal, e.g. binary signal. The transmitter component may include further input terminals and/or may also include control-side output terminals.

The first semiconductor portion may include doped regions of a control-side interface circuit. For example, the control-side interface circuit includes MOSFETs (metal oxide semiconductor field effect transistors) and diodes, and the first semiconductor portion may include MOSFET source regions, MOSFET drain regions, MOSFET channel regions, diode anode regions and diode cathode regions of the control-side interface circuit. In addition to the doped regions, the control-side interface circuit may include further elements such as resistor elements, capacitive elements and inductive elements, which may be formed on a first main surface at a front side of the first semiconductor portion and/or in trenches extending into the first semiconductor portion.

The control-side interface circuit may convert a digital input signal received at the input terminal(s) into a transmit radio frequency signal. For example, the control-side interface circuit may include a local oscillator circuit and a modulator circuit. The local oscillator circuit may include an LC oscillator, a ring oscillator or another oscillator. The local oscillator circuit generates an RF (radio frequency) carrier signal. A frequency of the RF carrier signal may be in a range from 12 GHz to 110 GHz, e.g. from 25 GHz to 90 GHz, or from 40 GHz to 75 GHz. The modulator circuit may encode the digital input signal with the RF carrier signal, wherein the modulator circuit may use ASK (amplitude shift keying), e.g. OOK (on/off keying), FSK (frequency shift keying), PSK (phase shift keying), PAM (pulse amplitude modulation) or derivations thereof, e.g. QAM (quadrature amplitude modulation). An amplifier circuit may amplify the output signal of the modulator circuit.

The control-side metallization structure may be formed on at least one of the two horizontal main surfaces of the first semiconductor portion. For example, the control-side metallization structure may be formed at the front side of the first semiconductor portion. The control-side metallization may be formed in one single metallization plane or may include portions in more than one metallization plane. The control-side metallization structure may be formed without protrusions extending beyond the outer lateral edge of the first semiconductor portion and may be formed completely within the lateral outer edge of the first semiconductor portion.

An interlayer dielectric layer may be formed between the first semiconductor portion and the lowermost metallization plane. Further interlayer dielectric layers may be formed between neighboring metallization planes. Interlayer connections may extend through the interlayer dielectric layers and may locally electrically connect portions of the metallization planes with each other and with the first semiconductor portion.

The control-side metallization structure includes at least a portion of a control-side antenna structure. The control-side antenna structure emits the transmit radio frequency signal, e.g. the amplified modulator output signal, as radio wave. The radio wave includes electromagnetic radiation in a frequency range from 12 GHz to 110 GHz, e.g. from 25 GHz to 90 GHz, or from 40 GHz to 75 GHz. The control-side antenna structure may include a series inductance for increasing the electrical length of the antenna structure.

The control-side antenna structure matches the transmit radio frequency signal. For example, an electrical length of the antenna structure is or approximates $\lambda/2$ or $\lambda 2/4$, with $\lambda$ representing the wavelength of the emitted radio wave such that the resonance frequency of the control-side antenna structure is at or close to the transmit radio frequency and emits the transmit radio frequency signal at high efficiency. For example, an antenna efficiency (German: Antennenwirkungsgrad) given by a total power radiated by the antenna divided by an input power at an antenna feedpoint may have a maximum value at the RF carrier frequency.

The radiation pattern of the control-side antenna structure may have a pronounced main lobe in one horizontal direction in the plane of the control-side metallization structure. The pronounced main loop may reduce cross-talk between neighboring transmitter components, e.g. neighboring gate driver circuits arranged on a single substrate carrier as it may be the case in an IGBT module.

According to another example, the radiation pattern of the control-side antenna structure may show rather weak directivity such that less restrictions apply for the arrangement of a receiver component data-linked to the transmitter component. Weaker antenna directivity may allow more mismatch between the transmitter component and the corresponding receiver component and may allow a certain misplacement without too much impact during production. In addition, antenna structures with weaker directivity may be formed in a more space-saving manner such that the control-side antenna structure can be formed on a semiconductor portion with comparatively small horizontal cross-sectional area.

The control-side antenna structure may include further parts outside the control-side metallization structure, e.g. bond wires and/or metal clips. The further parts of the control-side antenna structure may be completely formed within the lateral outer edge of the first semiconductor portion or may extend beyond the lateral outer edge of the first semiconductor portion.

The control-side metallization structure may include further metal structures, e.g. conductor paths, contact pads and/or radio wave reflector structures. The conductor paths may form parts of electrical connections between electric elements of the control-side interface circuit. The contact pads may form terminals of the transmitter component. Alternatively, bond wires and/or metal clips may connect the contact pads with carrier terminals of a carrier structure, wherein the carrier terminals may be separated parts of a lead frame.

The control-side interface circuit may further include an auxiliary receiver circuit. The auxiliary receiver circuit may convert an auxiliary radio wave received through the control-side antenna structure or through an auxiliary receive antenna structure into an auxiliary digital receive signal and may output the auxiliary digital receive signal at one or between two control-side output terminals of the transmitter component.

The transmitter component may be efficiently used for signal transmission to an integrated circuit which is not electrically connected to, e.g. galvanically isolated from, the transmitter component.

Another embodiment refers to a receiver component that may include an output terminal, a second semiconductor portion and a driver-side metallization structure. The receiver component may be monolithically integrated together with at least one further component, may share a common package with at least one further component, or may be an individually packaged solid-state semiconductor device.

The receiver component may include at least one output terminal. For example, the receiver component may include one single output terminal and outputs an output signal between the output terminal and a second reference voltage terminal to which a second reference voltage is applied. The second reference voltage may be a negative driver-side voltage supply. According to another example, the receiver component may include two output terminals and outputs the output signal as differential signal between the two output terminals. The output signal may be a digital signal, e.g. binary signal. The receiver component may include further output terminals and/or may also include driver-side input terminals.

The second semiconductor portion may include doped regions of a driver-side interface circuit. For example, the driver-side interface circuit may include MOSFETs and diodes, and the second semiconductor portion may include MOSFET source regions, MOSFET drain regions, MOSFET channel regions, diode anode regions and diode cathode regions of the driver-side interface circuit. In addition to the doped regions, the driver-side interface circuit may include further elements such as resistor elements, capacitive elements and inductive elements, which may be formed on a first main surface at the front side of the second semiconductor portion and/or in trenches extending into the second semiconductor portion.

The driver-side interface circuit may convert a receive radio frequency signal into a driver signal and outputs the driver signal at the output terminal. For example, the driver-side interface circuit may include a passive or active rectifying circuit for demodulating ASK, e.g. OOK, or PAM modulated radio signals.

Alternatively, the driver-side interface circuit may include a local oscillator circuit and a demodulator circuit. The local oscillator circuit generates an RF mixer signal. A frequency of the RF mixer signal may be in a range from 12 GHz to 110 GHz, e.g. from 25 GHz to 90 GHz, or from 40 GHz to 75 GHz. From signals modulated by FSK (frequency shift keying), PSK (phase shift keying), or derivatives thereof, e.g. QAM (quadrature amplitude modulation) and encoded with an RF carrier frequency equal to or approximating the RF mixer frequency, the demodulator circuit may obtain the original digital base band signal directly or through a suitable IF (intermediate frequency) signal.

The driver-side interface circuit amplifies the rectified signal output by the rectifying circuit or the base band signal obtained by the demodulator circuit and outputs the amplified signal as driver signal at the output terminal(s). The driver signal may be a digital signal, e.g. a binary or ternary signal. For example, the output terminal may be electrically connected to a control input terminal of a power switch. The driver-side interface circuit may alternately output an off-signal with a first voltage level and an on-signal with a second voltage level, wherein the first voltage level turns the power switch off and wherein the second voltage level turns the power switch on. For example, the driver-side interface circuit may include a push-pull output stage capable of dynamically sourcing and sinking several mA, e.g. at least 1 mA, at least 10 mA or at least 50 mA to several A, e.g. 2 A.

The driver-side metallization structure may be formed on at least one of the two horizontal main surfaces at a front side of the second semiconductor portion or opposite to the front side. For example the driver-side metallization structure may be formed at the front side of the second semiconductor portion. The driver-side metallization may be formed in one single metallization plane or may include parts in more than one metallization plane. The driver-side metallization structure may be formed without protrusions extending beyond the outer lateral edge of the second semiconductor portion and may be formed completely within the lateral outer edge of the second semiconductor portion.

An interlayer dielectric layer may be formed between the second semiconductor portion and the lowermost metallization plane. Further interlayer dielectric layers may be formed between neighboring metallization planes. Interlayer connections may extend through the interlayer dielectric layers and may locally electrically connect portions of the metallization planes with each other and with the second semiconductor portion.

The driver-side metallization structure includes at least a portion of a driver-side antenna structure. The driver-side antenna structure transforms a radio wave, i.e. electromagnetic radiation in a frequency range from 12 GHz to 110 GHz, e.g. from 25 GHz to 90 GHz, or from 40 GHz to 75 GHz, into a receive radio frequency signal. The driver-side antenna structure may include a series inductance for increasing the electrical length of the antenna structure.

The driver-side antenna structure matches a receiver frequency of the driver-side interface circuit. For example, the receiver frequency may match the time constants of the rectifying circuit or the RF mixer frequency. For example, an electrical length of the antenna structure is or approximates $\lambda/2$ or $\lambda/4$, with $\lambda$ representing the wavelength of the receiver frequency. The driver-side antenna structure may receive a radio wave using a carrier signal equal to the receiver frequency at high efficiency. For example, antenna efficiency may have a maximum value at the receiver frequency.

The radiation pattern of the driver antenna structure may have a pronounced main lobe in one horizontal direction in the plane of the driver-side metallization structure. The pronounced main loop may reduce interference with neighboring transmission paths, e.g. the transmission paths of gate driver circuits arranged on the same substrate carrier as it may be the case in an IGBT module.

According to another example, the radiation pattern of the driver-side antenna structure may show rather weak directivity such that less restrictions apply for the arrangement of the receiver component data-linked to a transmitter component. Weaker antenna directivity may allow more mismatch between the receiver component and the corresponding transmitter component and may allow a certain misplacement. In addition, antenna structures with weaker directivity may be formed in a more space-saving manner such that the driver-side antenna structure can be formed on a semiconductor portion with comparatively small horizontal cross-sectional area.

The driver-side antenna structure and the control-side antenna structure may have the same outline and/or dimensions. The driver-side antenna structure and the control-side antenna structure may have the same antenna directivity, wherein the driver-side antenna structure may be formed in the main loop of the control-side antenna structure and vice versa. For example, the driver-side antenna structure and the control-side antenna structure may be formed symmetrically with respect to a vertical plane between the transmitter component and the receiver component.

The driver-side antenna structure may include further parts outside the driver-side metallization structure, e.g. bond wires and/or metal clips. The further parts of the driver-side antenna structure may be completely formed within the lateral outer edge of the second semiconductor portion or may extend beyond the lateral outer edge of the second semiconductor portion.

The driver-side metallization structure may include further metal structures, e.g. conductor paths, contact pads and/or radio wave reflector structures. The conductor paths may form parts of electrical connections between electric elements of the driver-side interface circuit. The contact pads may form terminals of the receiver component. Alternatively, bond wires and/or metal clips may connect the contact pads with carrier terminals of a carrier structure, wherein the carrier terminals may be separated parts of a lead frame.

The driver-side interface circuit may further include an auxiliary transmitter circuit. The auxiliary transmitter circuit may amplify and/or buffer a low-power signal applied to a driver-side input terminal or between two driver-side input terminals of the receiver component. The auxiliary transmitter circuit may convert the amplified/buffered low-power input signal into an auxiliary radio frequency signal and may output the auxiliary radio frequency signal to the driver-side antenna structure or to an auxiliary transmit antenna structure. The driver-side antenna structure or the auxiliary transmit antenna structure may emit the auxiliary radio frequency signal as an auxiliary radio wave.

The receiver component may be efficiently used for receiving signals from an integrated circuit which is not electrically connected to, e.g. galvanically isolated from the receiver component.

Another embodiment refers to a transceiver circuit that may include the transmitter component as described above and that may include the receiver component as described above. The receiver component may be adapted to recover the digital input signal encoded and transmitted by the transmitter component. Transmitter component and receiver component are complementary components that work together for gating information from a first side to a second side.

The transceiver circuit may be a solid-state integrated circuit monolithically integrating at least the semiconducting portions of the transmitter component and the complementary receiver component. Alternatively, the transceiver circuit may be a single integrated circuit integrating a complementary pair of separated transmitter and receiver components in a single package. Alternatively, the transceiver circuit may include a complementary pair of integrated communications circuits, one of them including the transmitter component and the other including the complementary receiver component, wherein the complementary pair of integrated communications circuits may be mounted side-by-side on a carrier substrate such as a PCB (printed circuit board) or DCB (direct copper bond) ceramic substrate, by way of example.

The transmit radio frequency signal emitted by the transmitter component and the receive radio frequency signal in the receiver component may match. For example, the driver-side antenna structure is capable of receiving the radio wave emitted by the transmitter component at high efficiency. The driver-side antenna structure may have a maximum efficiency at that RF carrier frequency which the transmit component uses for encoding the digital input signal. The control-side and the driver-side antenna structure match and may have the highest antenna efficiency at the same frequency. The RF mixer frequency in the receiver component may match the RF carrier frequency used in the transmitter component. For example, the mixer circuit may be adapted to transform the transmit radio frequency signal into a suitable IF signal or into the base band signal.

Accordingly, the auxiliary receiver circuit in the transmitter component and the auxiliary transmitter circuit in the receiver component may match. In other words, the auxiliary receiver circuit in the transmitter component may be adapted to recover the auxiliary input signal encoded and transmitted by the auxiliary transmitter circuit in the receiver component. Also in this respect, transmitter component and receiver component are complementary components that work together for gating information from the second side to the first side.

The transceiver circuit facilitates the control of an electrically controllable actuator, e.g. a power switch, by a logic-level control signal without the need of conductor paths for signal transmission between a control circuit and the actuator.

According to an embodiment, the transmitter component and the receiver component may be galvanically isolated from each other.

The first semiconducting portion of the transmitter component, the control-side antenna structure, the control-side metallization, and the input terminal assigned to the transmitter component, the output terminal(s) assigned to the transmitter component and all further metallic and/or semiconducting portions of the transmitter component form a first functional section.

The second semiconducting portion of the receiver component, the driver-side antenna structure, the driver-side metallization, and the input terminal assigned to the receiver component, the output terminal(s) assigned to the receiver component and all further metallic and/or semiconducting portions of the receiver component form a second functional section.

A galvanic isolation structure may dielectrically separate the first functional section and the second functional section. The galvanic isolation structure may be a one-part structure or may include a plurality of different structures of different dielectric materials including air gaps. The dielectric breakdown strength of the galvanic isolation structure is in the range of several kV, e.g. at least 1 kV or about 8 kV. The galvanic isolation structure, the transmitter component, and the receiver component may be monolithically integrated. Alternatively, the galvanic isolation structure may be formed in between a chip-like transmitter component and a chip-like receiver component in one single package including the chip-like transmitter component and the chip-like receiver component. Alternatively, the galvanic isolation structure may be formed in and/or on a carrier substrate on which an integrated circuit including the transmitter component and an integrated circuit including the receiver component are formed.

The transceiver circuit facilitates the control of actuators, e.g. power switches, by logic-level control signals across a galvanically isolating barrier running between the transmitter component and the receiver component.

According to an embodiment, the driver-side antenna structure is formed where a radiation pattern of the control-side antenna structure has a maximum. In addition, the control-side antenna structure may be formed where a radiation pattern of the driver-side antenna structure has a maximum.

For example, the control-side antenna structure and the driver-side antenna structure may be coplanar or at least approximately coplanar.

The radiated power of the control-side antenna structure may be precisely tailored to be sufficiently high to ensure a predetermined minimum signal-to-noise ratio at the driver-side antenna structure and at the same time to be sufficiently low such that no further receiver component of another transceiver circuit locks into the radio wave of a specific transceiver circuit.

According to an embodiment, the control-side antenna structure may include a dipole antenna and the driver-side antenna structure may include a dipole antenna. Alternatively, the control-side antenna structure may include a monopole antenna and the driver-side antenna structure may include a monopole antenna.

Each dipole/monopole antenna may include a straight conductor stripe, wherein the radiation pattern of the dipole/monopole antenna has a maximum in all directions perpendicular to the conductor stripe. The conductor stripe of the control-side antenna structure and the conductor stripe of the driver-side antenna structure may run parallel or at least approximately parallel to each other and in the same horizontal plane or approximately in the same horizontal plane.

In case the control-side antenna structure and/or the driver-side antenna structure further includes a radio wave reflector structure in the plane of the conductor stripe, the radiation pattern may have a maximum in one single direction perpendicular to the conductor stripe and opposite to the radio wave reflector structure. The conductor stripe of the control-side antenna structure and the conductor stripe of the driver-side antenna structure may be arranged such that the radio wave reflector structure for the control-side antenna structure and the driver-side antenna structure are on opposite longitudinal sides of the control-side antenna structure and/or such that the radio wave reflector structure for the driver-side antenna structure and the control-side antenna structure are on opposite longitudinal sides of the driver-side antenna structure.

In this way, and without providing any addressing schemes and without using different frequencies for each transceiver circuit, it may be possible to operate a plurality of transceiver circuits on the same carrier substrate, e.g. in an IGBT module (insulated gate bipolar transistor module), without any signal interference between neighboring transceiver circuits.

According to an embodiment, the control-side metallization structure may include a first antenna pad. The transceiver circuit may further include a first bond wire. A first wire end of the first bond wire may be in direct contact with the first antenna pad. The driver-side metallization structure may include a second antenna pad. The transceiver circuit may further include a second bond wire. A first wire end of the second bond wire may be in direct contact with the second antenna pad.

The first bond wire may form most of the control-side antenna structure or may increase the electrical length of the control-side antenna structure without the need of increasing a horizontal cross-sectional area of the first semiconductor portion. The second bond wire may form most of the driver-side antenna structure or may increase the electrical length of the driver-side antenna structure without the need of increasing a horizontal cross-sectional area of the second semiconductor portion. The longer effective antenna lengths may facilitate the use of lower radio frequencies for the radio waves used in the transceiver circuit.

According to an embodiment, the control-side metallization structure may further include a first auxiliary pad and/or the driver-side metallization structure may include a second auxiliary pad. A second wire end of the first bond wire may be in direct contact with the first auxiliary bond pad. A second wire end of the second bond wire may be in direct contact with the second auxiliary pad.

The first and second bond wires may increase the electrical length of the antenna structures without the need of increasing the horizontal cross-sectional areas of the transmitter component and/or the receiver component.

According to an embodiment, the transceiver circuit may include first power supply terminals. The control-side interface circuit may be electrically supplied through the first power supply terminals. In addition or alternatively, the transceiver circuit may include second power supply terminals, wherein the driver-side interface circuit may be electrically supplied through the second power supply terminals.

The transceiver circuit may be realized with low horizontal cross-sectional area. Smaller transceiver circuits may be provided in a cost-effective manner and/or may save space on substrate carriers.

According to an embodiment the transmitter component and terminals electrically coupled to the transmitter component may be arranged in a first portion of the transceiver circuit. The receiver component and terminals electrically coupled to the receiver component may be arranged in a complementary second portion of the transceiver circuit. The first portion and the second portion may face each other on opposite sides of a vertical plane. Along the vertical plane an intermediate galvanic isolation structure may be formed.

The galvanic isolation structure may be provided in a comparative simple and reliable way facilitating a classification test for dielectric breakdown and saving costly part-to-part tests for dielectric breakdown. First bond wires and/or metal clips for the control-side and second bond wires and/or metal clips for the driver-side may be attached to opposite lateral sides of the transceiver circuit and may be drawn into opposite directions, wherein reliability of the galvanic isolation can be further improved.

For example, the first portion and the second portion may have rectangular horizontal cross-sections, may be formed side-by-side in the horizontal plane and may complement each other to a rectangular horizontal cross-sectional shape. The galvanic isolation structure may be or may include a slice, plate or air gap cutting vertically between the first portion and the second portion or may include one or more horizontally layered structures.

According to an embodiment the transceiver circuit may include a semiconductor body that may include the first semiconductor portion, the second semiconductor portion and a substrate layer portion. The first semiconductor portion and the second semiconductor portion may be formed side-by-side on a top surface of the substrate layer portion.

The transceiver circuit may be one single integrated circuit monolithically integrating at least the transmitter component and the receiver component. Both the distance and the galvanic isolation structure between the transmitter component and the receiver component can be defined at wafer level. The transmission properties can be to a high degree predictable. The radiation power may be finely tuned to avoid interference with other transceiver circuits of the same type.

According to another embodiment the transceiver circuit may include a carrier structure. The carrier structure may include separated carrier terminals. The transmitter component and the receiver component may be arranged side-by-side on a mounting surface of the carrier structure. For example, the transmitter component may be mounted on a first carrier terminal and the receiver component may be mounted on a second carrier terminal. The first and second carrier terminals may be initially connected as parts of a lead frame and may be separated from each other after mounting the transmitter component and the receiver component.

In addition, the input terminal(s) of the transmitter component and the output terminal(s) of the receiver component may be formed as further carrier terminals. The further carrier terminals may be initially connected as parts of the lead frame and may be separated from each other after mounting the transmitter component and the receiver component.

In addition, the driver-side input terminals, the control-side output terminals, the first power supply terminals, and/or the second power supply terminals may be formed as further carrier terminals. Bond wires may electrically connect contact pads on the transmitter component and contact pads on the receiver component with the further carrier terminals. A package mold may encapsulate the transmitter component, the receiver component, the bond wires and portions of the carrier terminals.

The transceiver circuit is one single integrated circuit integrating at least the transmitter component and the receiver component in a common package. Both the distance and the galvanic isolation structure between the transmitter component and the receiver component are defined at device level. The transmission properties can be predictable to a high degree. The radiation power may be finely tuned to avoid interference with other transceiver circuits of the same type.

According to a further embodiment the transmitter component and the receiver component may be arranged side-by-side on a mounting surface of a carrier substrate. Terminals of the transmitter component and terminals of the receiver component may be in contact with carrier contact pads on the carrier substrate mounting surface.

The transceiver circuit includes two separated complementary integrated circuits, one of them integrating at least the transmitter component and the other integrating the receiver component. Both the distance and the galvanic isolation structure between the transmitter component and the receiver component are defined at PCB level.

Another embodiment refers to a gate driver circuit with the transceiver circuit as described above. The driver-side interface circuit is configured to drive a gate signal for a power semiconductor switch.

According to an embodiment, the gate driver circuit may include a push-pull inverter stage configured to drive a dynamic output current of several mA, e.g. at least 1 mA, at least 10 mA or at least 50 mA and up to several A, e.g. 2 A.

FIG. 1 shows a transmitter component 100 with a control-side interface circuit 120. Doped regions of the control-side interface circuit 120 are formed in a first semiconductor portion 110 with a planar first main surface 111 at a front side and a planar second main surface 112 opposite to the front side. The first and second main surfaces 111, 112 are formed in parallel horizontal planes and are spaced from each other along a vertical direction. A lateral outer surface 113 connects the edges of the first and second main surfaces 111, 112. A horizontal cross-sectional area of the first semiconductor portion 110 may be in a range of several $mm^2$, e.g. from 1 $mm^2$ to 16 $mm^2$ or from 2 $mm^2$ to 5 $mm^2$, for example about 3 $mm^2$.

The first semiconductor portion 110 may include one or more single crystalline semiconductor materials selected from elemental semiconductors like silicon (Si) and germanium (Ge), group IV compound semiconductors like silicon germanium (SiGe) and silicon carbide (SiC), and group III-V compound semiconductors like gallium nitride (GaN) and gallium arsenide (GaAs).

An interlayer dielectric layer 150 is formed on the first main surface 111 of the first semiconductor portion 110. The interlayer dielectric layer 150 may be a homogenous layer or may include two or more sublayers including silicon oxide, silicon nitride, and/or a silicate glass. A control-side metallization structure 160 is formed on the interlayer dielectric layer 150 of the first semiconductor portion 110. The control-side metallization structure 160 may consist of or include aluminum (Al), copper (Cu), and/or a copper alloy like CuAl or CuAlSi, by way of example. The control-side metallization structure 160 includes a control-side antenna structure 162 and contact pads 161. The contact pads 161 and the control-side antenna structure 162 may be laterally separated portions of the same metallization layer or may be formed in different metallization layers.

The control-side antenna structure 162 is completely within the lateral outer edge of the first semiconductor portion 110, wherein the lateral outer edge is given by the lateral outer surface 113.

One of the contact pads 161 may form an input terminal 101 or may be electrically connected to an input terminal 101 through a bond wire or a metal clip. The control-side antenna structure 162 may include an LC antenna including an inductor and a capacitor, a patch antenna, a dipole antenna, and/or a monopole antenna. Interlayer connections 159 may electrically connect the contact pads 161 and the control-side antenna structure 162 with doped regions in the first semiconductor portion 110 or with other conductive structures on or in the first semiconductor portion 110.

The control-side interface circuit 120 converts a digital input signal received at the input terminal 101 into a transmit radio frequency signal. The control-side antenna structure 162 emits the transmit radio frequency signal as radio wave.

Figure 2:
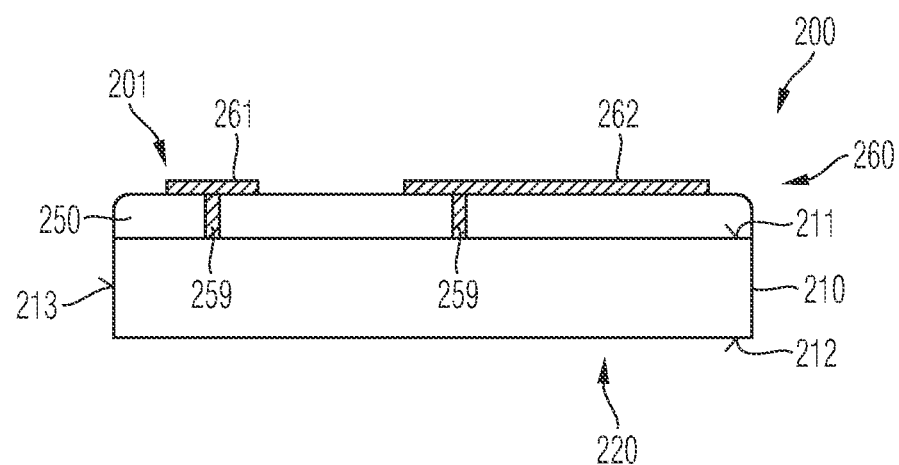
FIG. 2 is a schematic vertical cross-sectional view of a receiver component with an on-chip antenna structure according to an embodiment.

FIG. 2 shows a receiver component 200 with a driver-side interface circuit 220. Doped regions of the driver-side interface circuit 220 are formed in a second semiconductor portion 210 with a planar first main surface 211 at a front side and a planar second main surface 212 opposite to the front side. The first and second main surfaces 211, 212 are formed in parallel horizontal planes and are spaced from each other along a vertical direction. A lateral outer surface 213 connects the edges of the first and second main surfaces 211, 212. A horizontal cross-sectional area of the second semiconductor portion 210 may be in a range of several $mm^2$, e.g. from $1\ mm^2$ to $16\ mm^2$ or from $2\ mm^2$ to $5\ mm^2$, for example about $3\ mm^2$.

The second semiconductor portion 210 may include one or more single crystalline semiconductor materials selected from elemental semiconductors such as Si and Ge, group IV compound semiconductors like SiGe and SiC, and group III-V compound semiconductors like GaN and GaAs.

An interlayer dielectric layer 250 is formed on the first main surface 211 of the second semiconductor portion 210. The interlayer dielectric layer 250 may be a homogenous layer or may include two or more sublayers including silicon oxide, silicon nitride, and/or a silicate glass. A driver-side metallization structure 260 is formed on the interlayer dielectric layer 250 of the second semiconductor portion 210. The driver-side metallization structure 260 may consist of or include Al, Cu, AlCu, AlSiCu, by way of example. The driver-side metallization structure 260 includes a driver-side antenna structure 262 and contact pads 261. The contact pads 261 and the driver-side antenna structure 262 may be laterally separated portions of the same metallization layer or may be formed in different metallization layers.

The driver-side antenna structure 262 is completely within the lateral outer edge of the second semiconductor portion 210, wherein the lateral outer edge is given by the lateral outer surface 213.

One of the contact pads 261 may form an output terminal 201 or may be electrically connected to an output terminal 201 through a bond wire or a metal clip. The driver-side antenna structure 262 may include an LC antenna including an inductor and a capacitor, a patch antenna, a dipole antenna, and/or a monopole antenna. Interlayer connections 259 may electrically connect the contact pads 261 and the driver-side antenna structure 262 with doped regions in the second semiconductor portion 210 or with other conductive structures on or in the second semiconductor portion 210.

In the driver-side antenna structure 262 a radio wave induces a receive radio frequency signal. The driver-side interface circuit 220 converts the receive radio frequency into a digital, e.g. binary driver signal and outputs the driver signal at the output terminal 201.

The transceiver circuits 900 shown in FIG. 3A to 3C combine a complementary pair including a transmitter component 100 as described with reference to FIG. 1 and a receiver component 200 as described with reference to FIG. 2.

Figure 3A:
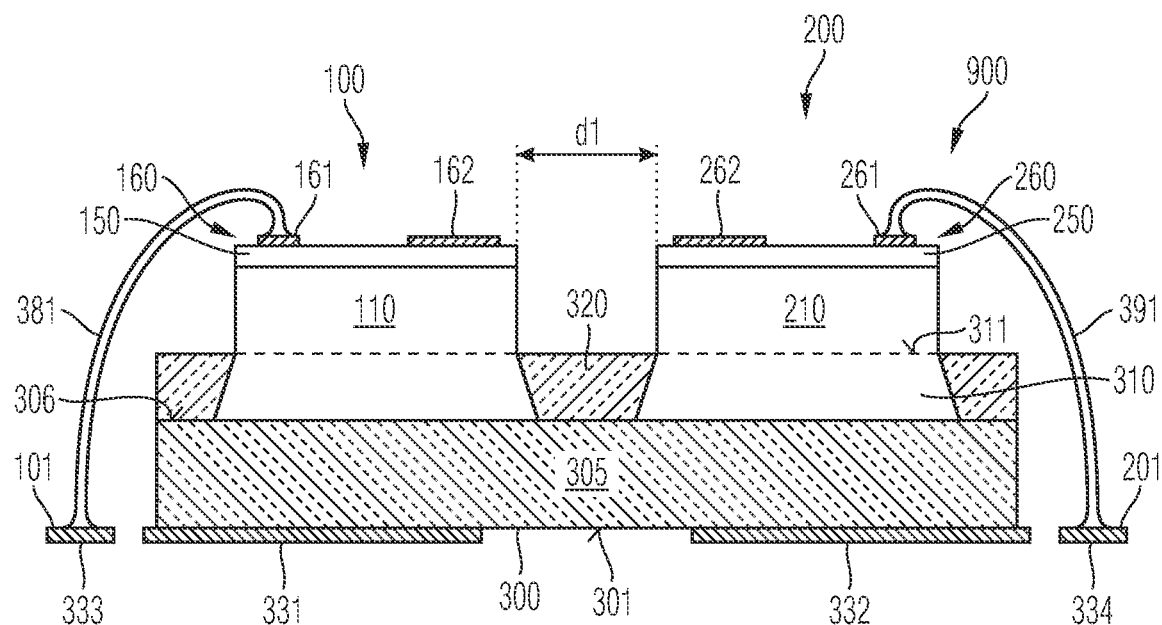
FIG. 3A is a schematic vertical cross-sectional view of a transceiver circuit according to an embodiment with semiconducting portions of a transmitter component and a complementary receiver component formed from portions of the same semiconductor substrate.

In FIG. 3A a transceiver circuit 900 monolithically integrates the first semiconductor portion 110 of a transmitter component 100 and the second semiconductor portion 210 of a complementary receiver component 200.

The first semiconductor portion 110 and the second semiconductor portion 210 are formed side-by-side on a top surface 311 of a substrate layer portion 310. The substrate layer portion 310 may be an intrinsic or low-doped semiconducting layer of an SOI (silicon-on-isolator) like or SOG (silicon-on-glass) like semiconductor body 300 that further includes a dielectric base substrate 305 on which the substrate layer portion 310 is formed.

The first and second semiconductor portions 110, 210 may have the same vertical extension such that the control-side antenna structure 162 and the driver-side antenna structure 262 are coplanar and have the same vertical distance to a front side surface 306 of the dielectric base substrate 305. A first lateral distance d1 between the first semiconductor portion 110 and the second semiconductor portion 210 may be in a range of millimeters, for example from 0.1 mm to 5 mm, from 0.5 mm to 1.5 mm or about 1 mm, by way of example.

A trench isolation 320 may extend from the layer portion top surface 311 into the layer portion 310, e.g. down to the dielectric base substrate 305.

The transceiver circuit 900 further includes coplanar leads 331, 332, 333, 334. A mounting surface 301 of the semiconductor body 300 may be connected to a first lead 331 and a second lead 332, wherein the first lead 331 and the second lead 332 may be laterally separated from each other directly below the trench isolation 320. Input bond wires 381 connect contact pads 161 of the control-side metallization structure 160 with third leads 333, which form the input terminals 101. Output bond wires 391 connect contact pads 261 of the driver-side metallization structure 260 with fourth leads 334, which form the output terminals 201. A package mold (not illustrated) may embed the input bond wires 381, the output bond wires 391, the first semiconductor portion 110, the second semiconductor portion 210 and portions of the leads 331, 332, 333, 334.

The transmitter component 100 and the receiver component 200 are formed on opposite sides of a vertical plane perpendicular to the illustrated cross-sectional plane. The control-side antenna structure 162 and the driver side antenna structure 262 are arranged directly opposite to each other, with no further portions of the control-side metallization structure 160 or the driver-side metallization structure 260 in between.

Figure 3B:
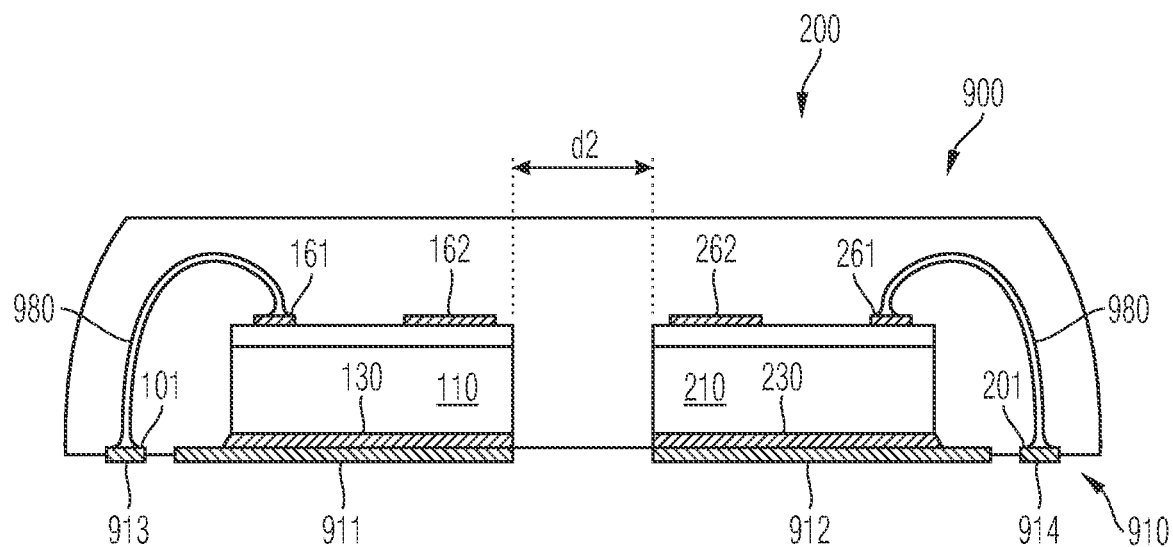
FIG. 3B is a schematic vertical cross-sectional view of a transceiver circuit according to an embodiment with a transmitter component and a complementary receiver component integrated in one packaging.

The transceiver circuit 900 illustrated in FIG. 3B integrates a complementary pair of a transmitter component 100 and a receiver component 200 in one single package. A carrier structure 910 includes a plurality of coplanar, laterally separated carrier terminals 911, 912, 913, 914.

The transmitter component 100 may include a bottom metallization 130 formed on the second main surface 112 of the first semiconductor portion 110. The bottom metallization 130 may be bonded or soldered onto a first carrier terminal 911. The receiver component 200 may include a bottom metallization 230 formed on the second main surface 212 of the second semiconductor portion 210. The bottom metallization 230 may be bonded or soldered onto second carrier terminal 912. The transmitter component 100 and the receiver component 200 are arranged side-by-side. A second lateral distance d2 between the first semiconductor portion 110 and the second semiconductor portion 210 may be in a range of millimeters, for example from 0.5 mm to 5 mm, from 0.8 mm to 1.5 mm or about 1 mm, by way of example.

In addition, the input terminal(s) 101 of the transmitter component 100 may be formed as third carrier terminal(s)

913 and the output terminal(s) 201 of the receiver component 200 may be formed as fourth carrier terminal(s) 914. Further input terminals, further output terminals, first power supply terminals of the transmitter component 100, and/or second power supply terminals of the receiver component 200 may include further third and fourth carrier terminals 913, 914.

Bond wires 980 may electrically connect contact pads 161 on the transmitter component 100 and contact pads 261 on the receiver component 200 with the third and fourth carrier terminals 913, 914. The carrier terminals 911, 912, 913, 914 may be initially connected as parts of a lead frame and may be separated from each other after bonding or soldering the first semiconductor portion 110 and the second semiconductor portion 210 onto the lead frame.

A package mold 990 may encapsulate the first semiconductor portion 110, the second semiconductor portion 210, the bond wires 980 and portions of the carrier terminals 911, 912, 913, 914.

Figure 3C:
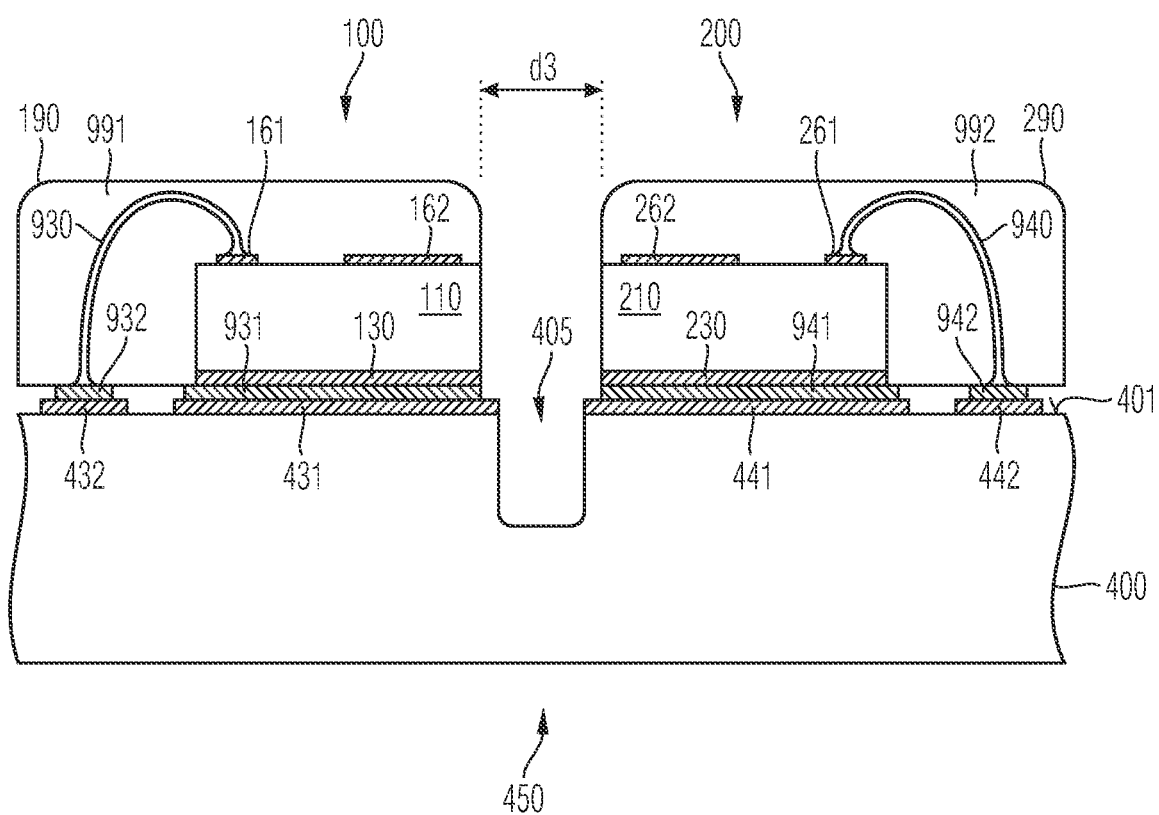
FIG. 3C is a schematic vertical cross-sectional view of a transceiver circuit according to an embodiment with a transmitter device including a transmitter component and with a receiver device including a complementary receiver component.

The transceiver circuit 900 illustrated in FIG. 3C includes a complementary pair of a transmitter device 190 and a receiver device 290 mounted on a carrier substrate 400 such as a PCB or DCB ceramic substrate.

The transmitter component 100 may include a bottom metallization 130 formed on the second main surface 112 of the first semiconductor portion 110. The bottom metallization 130 may be bonded or soldered onto a first transmitter terminal 931. Transmitter bond wires 930 may connect contact pads 161 of the transmitter component 100 with second transmitter terminals 932. The first and second transmitter terminals 931, 932 may be coplanar. A first package mold 991 may encapsulate the first semiconductor portion 110, the transmitter bond wires 930 and portions of the first and second transmitter terminals 931, 932.

The receiver component 200 may include a bottom metallization 230 formed on the second main surface 212 of the second semiconductor portion 210. The bottom metallization 230 may be bonded or soldered onto a first receiver terminal 941. Receiver bond wires 940 may connect contact pads 261 of the receiver component 200 with second receiver terminals 942. The first and second receiver terminals 941, 942 may be coplanar. A second package mold 992 may encapsulate the second semiconductor portion 210, the receiver bond wires 940 and portions of the first and second receiver terminals 941, 942.

The carrier substrate 400 includes coplanar conductive carrier contact pads 411, 412, 413, 414 formed on a carrier substrate mounting surface 401. The first transmitter terminal 931 is soldered onto a first carrier contact pad 431. The second transmitter terminals 932 are soldered onto second carrier contact pads 432. The first receiver terminal 941 is soldered onto a third carrier contact pad 441. The second receiver terminals 942 are soldered onto fourth carrier contact pads 442.

Parts of the carrier substrate 400 may form part of a galvanic isolation structure 450. The transmitter device 190, the first carrier contact pad 431 and the second carrier contact pads 432 are formed at a first side of the galvanic isolation structure 450. The receiver device 290, the third carrier contact pad 441 and the fourth carrier contact pads 442 are formed at an opposite second side of the galvanic isolation structure 450. Between the transmitter device 190 and the receiver device 290 a carrier substrate trench 405 may extend from the carrier substrate mounting surface 401 into the carrier substrate 400.

A third lateral distance d3 between the transmitter device 190 and the receiver device 290 may be in a range of millimeters, for example from 0.5 mm to 5 mm, from 0.8 mm to 1.5 mm or about 1 mm, by way of example.

Figure 4:
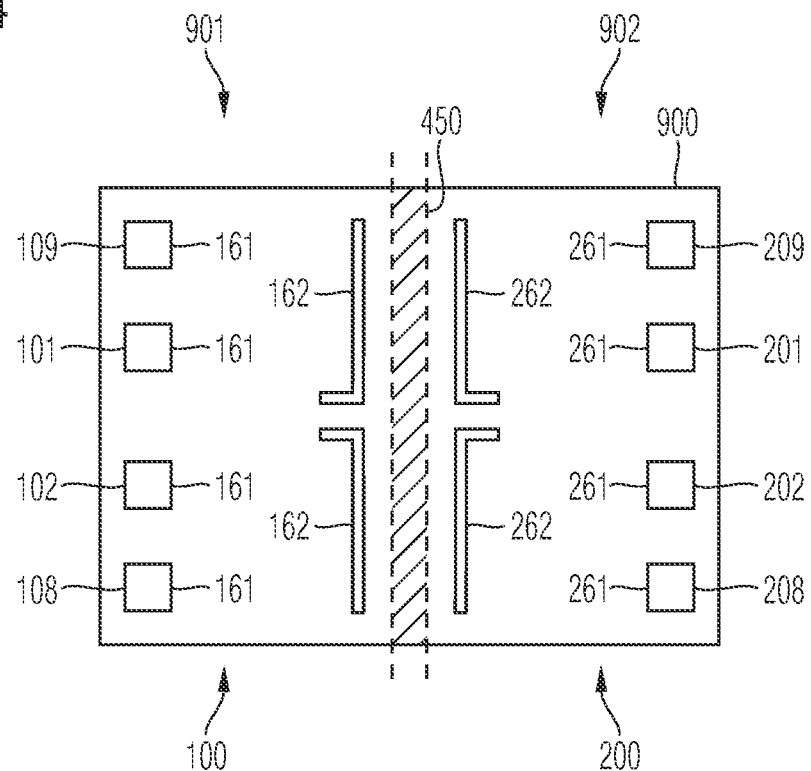
FIG. 4 is a schematic plan view of a transceiver circuit with on-chip antenna structures according to an embodiment.

In FIG. 4 the transmitter component 100 and transmitter terminals 101, 102, 108, 109 are arranged in a first portion 901 of the transceiver circuit 900. The transmitter terminals 101, 102, 108, 109 may include two input terminals 101, 102 and two first power supply terminals 108, 109. The receiver component 200 and receiver terminals 201, 202, 208, 209 are arranged in a complementary second portion 902 of the transceiver circuit 900. The receiver terminals 201, 202, 208, 209 may include two output terminals 201, 202 and two second power supply terminals 208, 209. The first portion 901 and the second portion 902 face each other on opposite sides of an intermediate galvanic isolation structure 450. The transmitter terminals 101, 102, 108, 109 may be contact pads 161 of the transmitter component 100. The receiver terminals 201, 202, 208, 209 may be contact pads 261 of the receiver component 200.

The control-side antenna structure 162 and the driver-side antenna structure 262 face each other at the intermediate galvanic isolation structure 450. The control-side antenna structure 162 and the driver-side antenna structure 262 are dipole antennas and may be formed mirror-inverted with respect to a vertical center plane.

Figure 5:
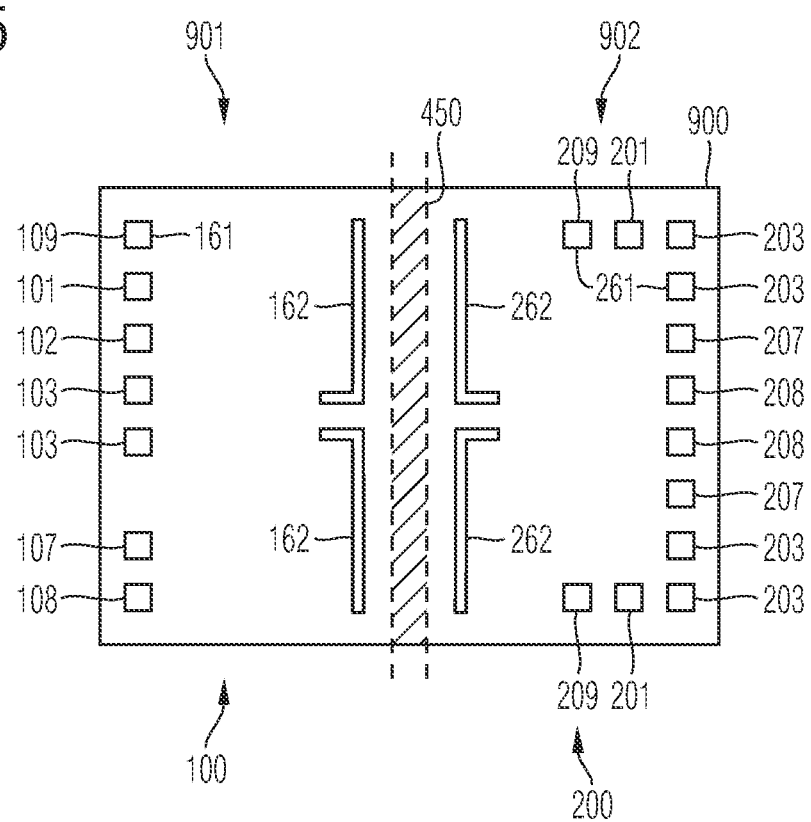
FIG. 5 is a schematic plan view of a gate driver circuit with on-chip antenna structures according to an embodiment.

In FIG. 5 the transmitter component 100 includes a pair of input terminals 101, 102, a pair of first power supply terminals 108, 109 supplying a low-voltage supply voltage, a first reference voltage terminal 103 and two control-side output terminals 103.

The receiver component 200 includes two set of terminals, wherein each set of terminals may include a pair of second power supply voltage terminals 208, 209, a second reference voltage terminal 207, an output terminal 201 and two driver-side input terminals 203.

The transceiver circuit 900 may be a gate driver circuit. The receiver component 200 is adapted to alternatively turn-on two complementary switches, e.g. a low-side switch and a high side switch in response to a control signal received through the driver-side antenna structure 262. Each set of terminals is assigned to one of the complementary switches. The receiver component 200 may include two Miller clamp circuits, each controlled by one of the driver-side input terminals 203. Further driver-side input terminals 203 may be used to detect a fault condition, wherein information about the fault condition may be transmitted from the receiver component 200 to the transmitter component 100 through an auxiliary transmitter circuit in the receiver component 200 and an auxiliary receiver circuit in the transmitter component 100. The transmitter component 100 may output digital fault signals received through the auxiliary receiver circuit at one of the control-side output terminals 103.

FIGS. 6A to 6D refer to different configurations of the transmission path between the control side and the driver side.

Figure 6A:
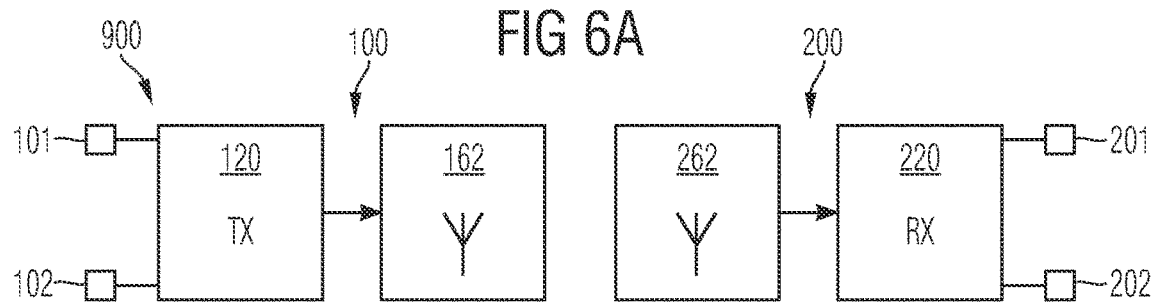
FIGS. 6A-6D are schematic block diagrams of transceiver circuits according to embodiments referring to different communications paths.

In FIG. 6A the transmission path is unidirectional from the control-side to the driver-side. The transceiver circuit 900 may be a gate driver device without status feedback.

Figure 6B:
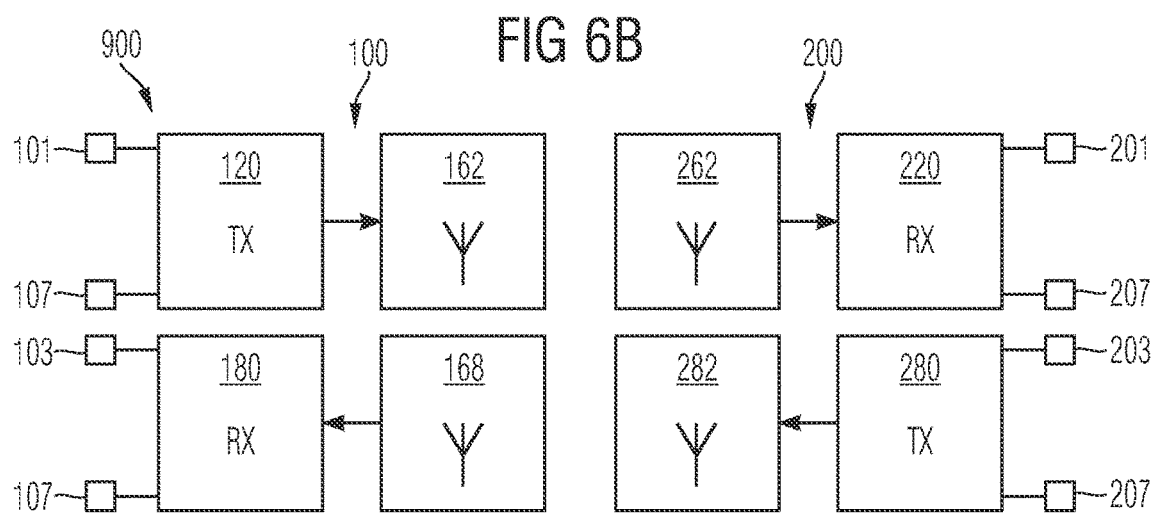
Figure 6C:
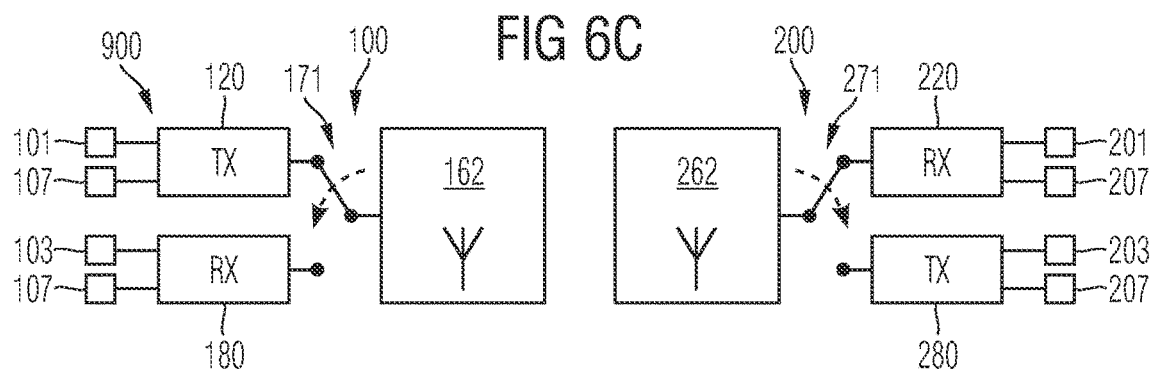
Figure 6D:
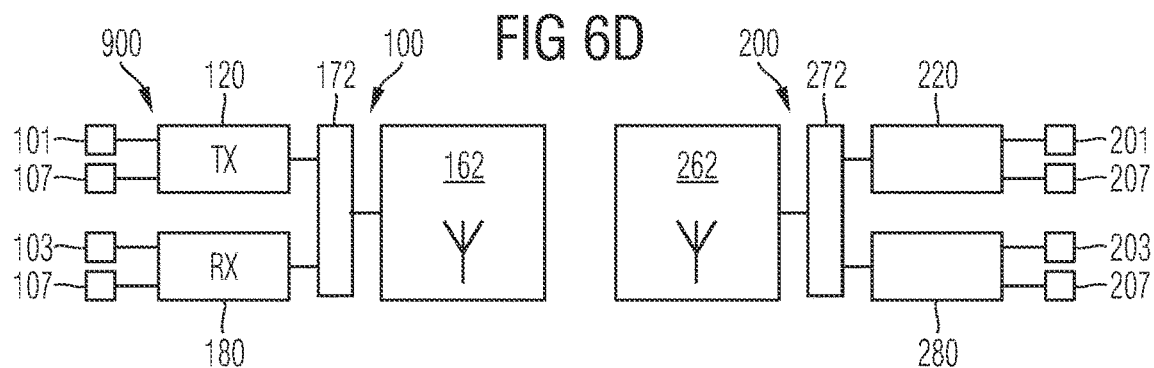

In FIGS. 6B to 6D, the transceiver circuits 900 may be gate driver circuits providing status feedback:

In FIG. 6B the transmission path is full duplex bidirectional between the control-side and the driver-side. The receiver component 200 includes a driver-side input terminal 203. An auxiliary transmitter circuit 280 encodes a fault signal applied to the driver-side input terminal 203 and an auxiliary transmit antenna structure 282 emits the encoded fault signal as a radio wave. The transmitter component 100 includes an auxiliary receive antenna structure 182 and an auxiliary receiver circuit 180 decoding the radio frequency signal received at the auxiliary receive antenna structure 182. The decoded fault signal is output at a control-side output terminal 103.

In FIG. 6C the transmitter component 100 includes a switch 171 for connecting the control-side antenna structure 162 alternatingly with the control-side interface circuit 120 and the auxiliary receiver circuit 180. The receiver component 200 includes a switch 271 for connecting the driver-side antenna structure 262 alternatingly with the driver-side interface circuit 220 and the auxiliary transmitter circuit 280. The switches 171, 271 are synchronized and facilitate half-duplex bidirectional transmission.

In FIG. 6D the transmitter component 100 includes a contraplex unit 172 coupling the control-side antenna structure 162 to the control-side interface circuit 120 and to the auxiliary receiver circuit 180. The receiver component 200 includes a contraplex unit 272 coupling the driver-side antenna structure 262 to the driver-side interface circuit 220 and to the auxiliary transmitter circuit 280. The contraplex units 172, 272 allow radio frequency signals passing in opposite directions at the same time and in this way facilitate full-duplex multiplexed bidirectional transmission, e.g. by frequency multiplexing.

Figure 7A:
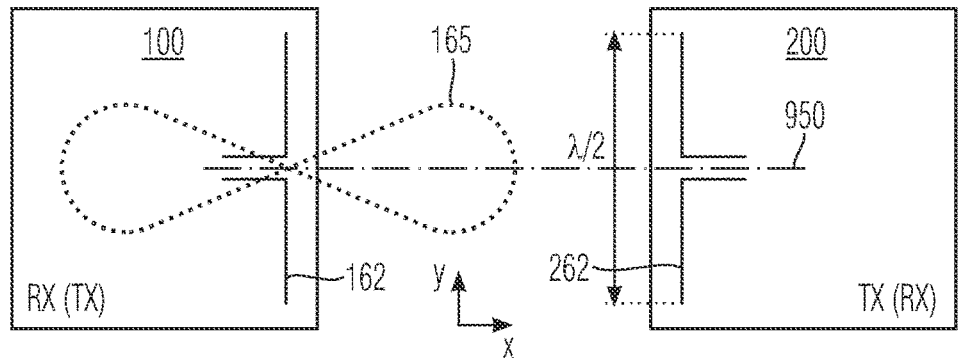
FIGS. 7A-7D are schematic plan views of transceiver circuits according to embodiments referring to different antenna configurations based on dipole antennas and monopole antennas.
Figure 7B:
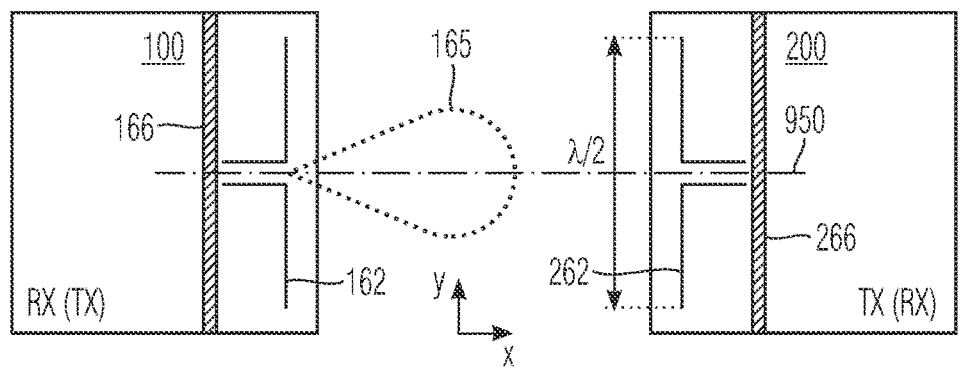

In FIGS. 7A to 7B the control-side antenna structures 162 and driver side antenna structures 162 are dipole antennas including straight conductor stripes with a longitudinal extension of λ/2 along the horizontal y-direction, wherein λ represents the wavelength of the received radio wave. In each transceiver circuit 900 the conductor stripes of the control-side antenna structure 162 and the driver side antenna structure 262 run parallel to each other and symmetrically with respect to a symmetry plane 950 cutting vertically through the longitudinal centers of the two dipole antennas.

In FIG. 7A the radiation pattern 165 of each dipole antenna is symmetric with respect to the longitudinal axis of the conductor stripe of the respective dipole antenna and symmetric with respect to the symmetry plane 950.

In FIG. 7B the transmitter component 100 includes a control-side reflector structure 166 at a side of the control-side antenna structure 162 opposite to the receiver component 200. The control-side reflector structure 166 may be formed exclusively in the metallization plane of the control-side antenna structure 162, may extend across more than one metallization plane, may protrude above the top most metallization plane and/or may extend to below the bottom most metallization plane. The control-side reflector structure 166 may shape the directivity of the radiation pattern 165 in a way that more radiation power is emitted into direction of the receiver component 200.

The receiver component 200 includes a driver-side reflector structure 266 at a side of the driver-side antenna structure 262 opposite to the transmitter component 100. The driver-side reflector structure 266 may be formed exclusively in the metallization plane of the driver-side antenna structure 262, may extend across more than one metallization plane, may protrude above the top most metallization plane and/or may extend to below the bottom most metallization plane. The driver-side reflector structure 266 may shape the directivity of the radiation pattern of the driver-side antenna structure 162 in a way that radiation power is more efficiently received from the direction of the transmitter component 100.

Figure 7C:
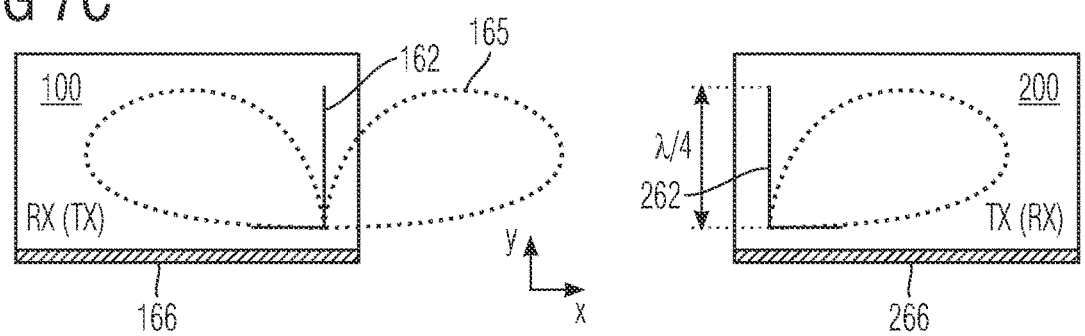
Figure 7D:
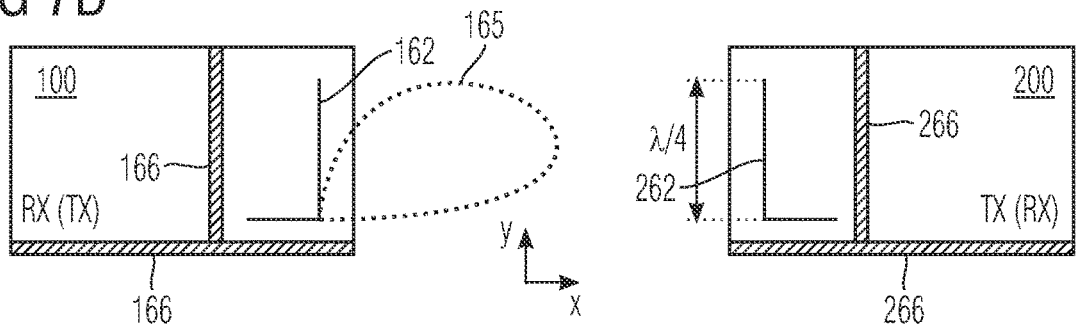

FIG. 7C and 7D show the effect of differently oriented portions of control-side reflector structures 166 and driver-side reflector structures 266 on the radiation pattern 165 of monopole antennas.

Figure 8A:
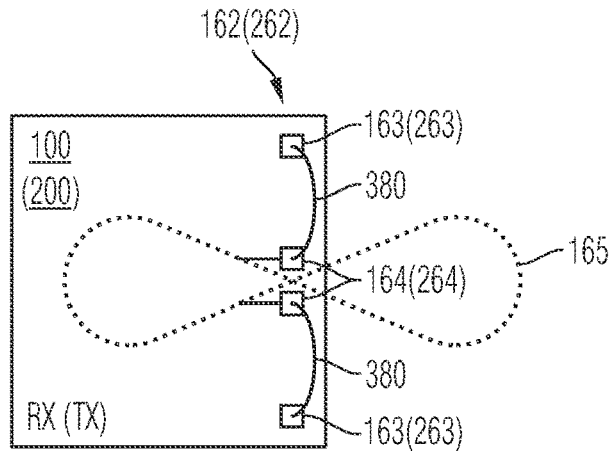
FIGS. 8A-8D are schematic plan views of transmitter (receiver) components according to embodiments with bond wires forming at least part of the respective antenna structure.

In FIG. 8A a control-side metallization structure 160 of the transmitter component 100 includes a pair of first antenna pads 164 and a pair of first auxiliary pads 163. The transmitter component 100 further includes first bond wires 380. Each first bond wire 380 connects a first antenna pad 164 and a first auxiliary pad 163. The first bond wires 380 may form the control-side antenna structure 162 completely or in parts. A driver-side antenna structure 262 with second antenna pads 264 and second auxiliary pads 263 may be formed accordingly and may be arranged mirror-inverted with respect to the control-side antenna structure 162.

Figure 8B:
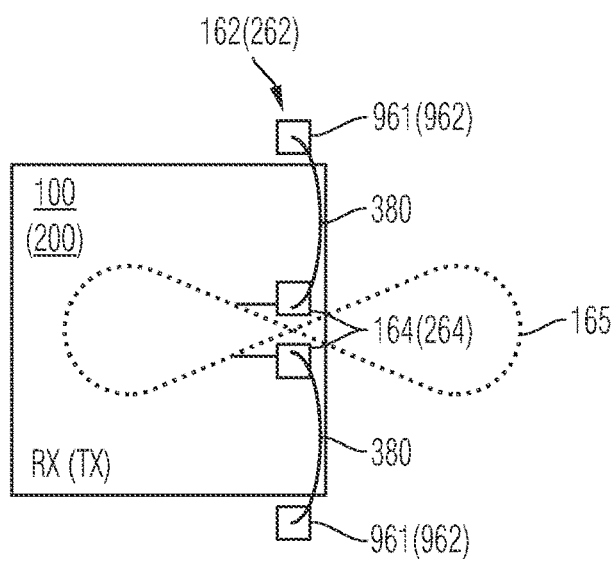

In FIG. 8B first (second) external pads 961 (962) are formed outside the transmitter component 100 (receiver component 200). For example, the first (second) external pads 961 (962) may be on carrier terminals of a carrier structure or may be contact pads on a carrier substrate such as a PCB of DCB ceramic substrate.

Figure 8C:
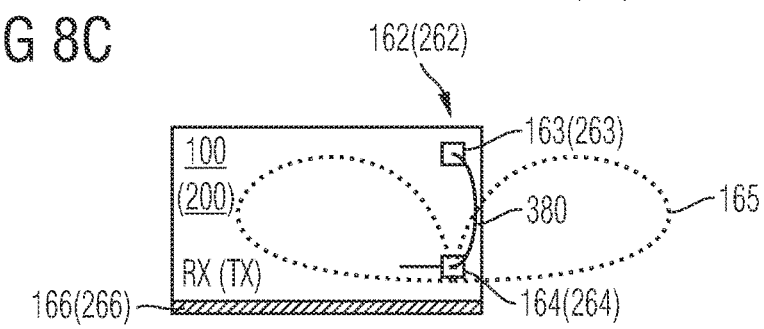
Figure 8D:
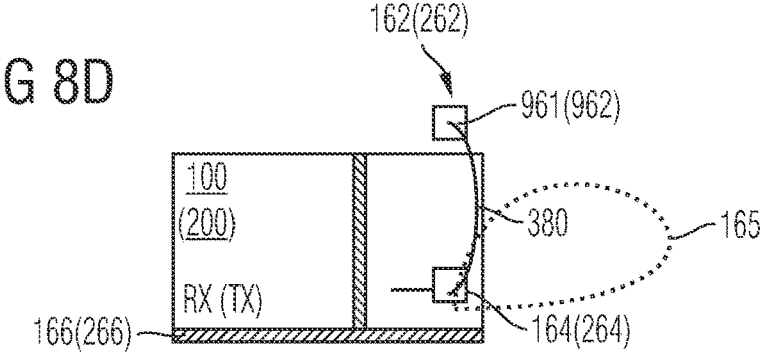

FIGS. 8C-8D show monopole control-side antenna structures 162 (driver-side antenna structures 262) including bond wires 380 electrically connecting one first (second) antenna pad 164 (264) and one first (second) auxiliary pad 163 (263) or one first (second) external pad 961 (962) for different control-side (driver-side) reflector structures 166 (266).

Figure 9:
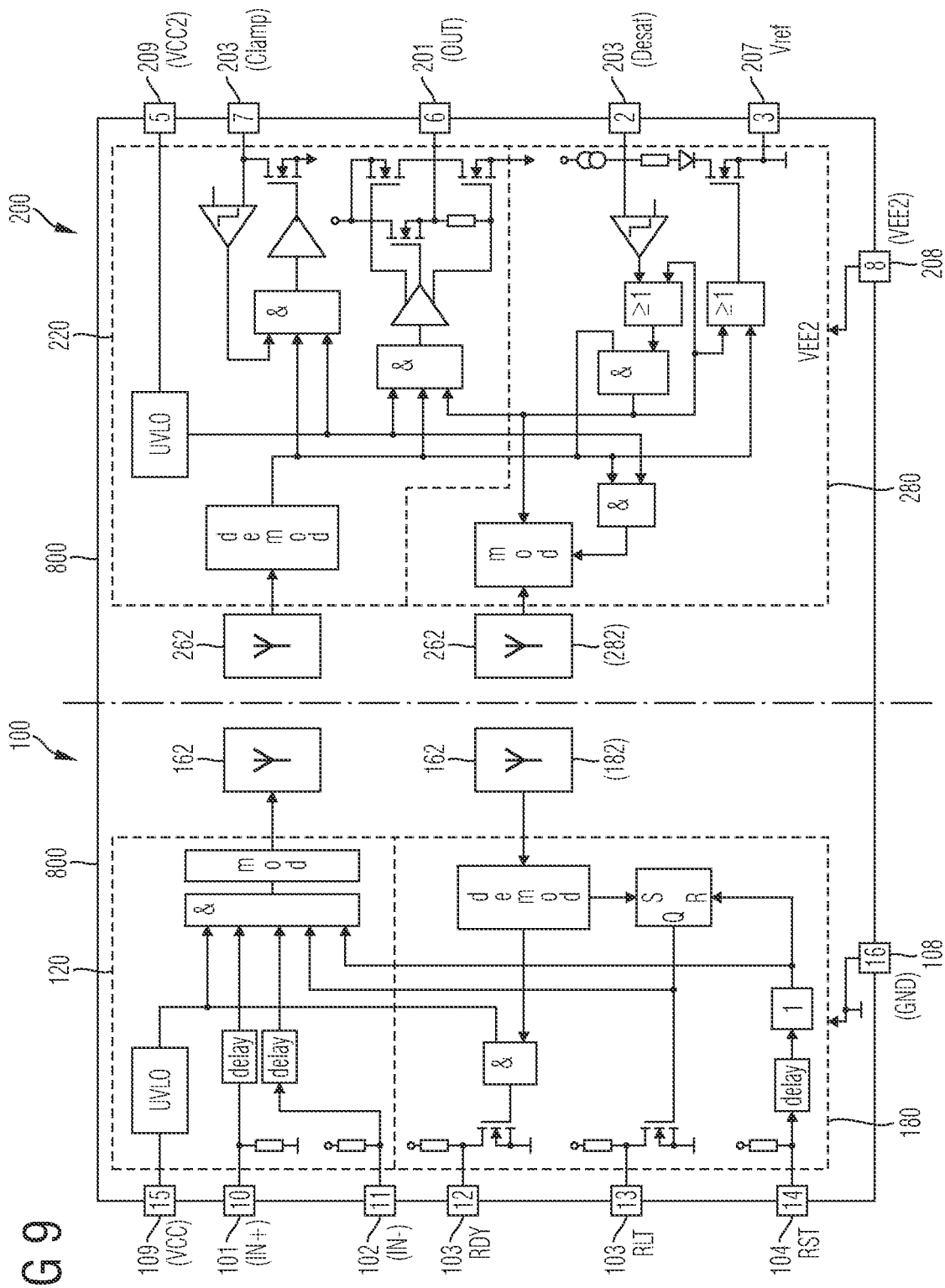
FIG. 9 is a schematic block diagram of a gate driver circuit with on-chip antenna structures according to an embodiment.

FIG. 9 shows a gate driver circuit 800 with a transmitter component 100 and receiver component 200 as described above.

Though the description focusses on directional antenna structures which radiate and/or receive greater power in specific directions, the embodiments may also include non-directional control-side antenna structures and/or driver-side antenna structures.

Though the description focusses on gate driver circuits, the embodiments may also include the transmission of control signals to other loads, e.g. low-voltage loads such as relays, active sensors and/or actuators that may be directly controllable through the output stage of the driver-side interface circuit. In such case the focus may be on breaking remote ground loops rather than switching high voltages/currents.

What is claimed is:

1. A transmitter component, comprising:
   an input terminal;
   a first semiconductor portion comprising doped regions of a control-side interface circuit, wherein the control-side interface circuit is configured to convert a digital input signal received at the input terminal into a transmit radio frequency signal; and
   a control-side metallization structure formed on at least one of two horizontal main surfaces of the first semiconductor portion, wherein the control-side metallization structure comprises at least a portion of a control-side antenna structure configured to emit the transmit radio frequency signal as radio wave.

2. A receiver component, comprising:
   an output terminal;
   a second semiconductor portion comprising doped regions of a driver-side interface circuit, wherein the driver-side interface circuit is configured to convert a receive radio frequency signal into a driver signal output at the output terminal; and
   a driver-side metallization structure formed on at least one of two horizontal main surfaces of the second semiconductor portion, wherein the driver-side metallization structure comprises at least a portion of a driver-side antenna structure configured to obtain the receive radio frequency signal from a radio wave.

3. A transceiver circuit, comprising:
the transmitter component of claims 1; and
the receiver component of claim 2,
wherein the receiver component is adapted to recover the digital input signal encoded and transmitted by the transmitter component.

4. The transceiver circuit of claim 3,
wherein the transmitter component and the receiver component are galvanically isolated from each other.

5. The transceiver circuit of claim 3,
wherein the driver-side antenna structure is formed where a radiation pattern of the control-side antenna structure has a maximum and wherein the control-side antenna structure is formed where a radiation pattern of the driver-side antenna structure has a maximum.

6. The transceiver circuit of claim 3,
wherein the control-side antenna structure comprises a dipole antenna and the driver-side antenna structure comprises a dipole antenna, or
wherein the control-side antenna structure comprises a monopole antenna and the driver-side antenna structure comprises a monopole antenna.

7. The transceiver circuit of claim 6,
wherein the control-side metallization structure comprises a first antenna pad and a first bond wire is in direct contact with the first antenna pad, and/or
wherein the driver-side metallization structure comprises a second antenna pad and a second bond wire is in direct contact with the second antenna pad.

8. The transceiver circuit of claim 7,
wherein the control-side metallization structure comprises a first auxiliary pad and a second wire end of the first bond wire is in direct contact with the first auxiliary pad, and/or
wherein the driver-side metallization structure comprises a second auxiliary pad and a second wire end of the second bond wire is in direct contact with the second auxiliary pad.

9. The transceiver circuit of claim 3, further comprising:
first power supply terminals, wherein the control-side interface circuit is configured to be electrically supplied through the first power supply terminals, and/or second power supply terminals, wherein the driver-side interface circuit is configured to be electrically supplied through the second power supply terminals.

10. The transceiver circuit of claim 3,
wherein the transmitter component and terminals electrically coupled to the transmitter component are arranged in a first portion of the transceiver circuit,
wherein the receiver component and terminals electrically coupled to the receiver component are arranged in a complementary second portion of the transceiver circuit, and
wherein the first portion and the second portion are on opposite sides of a vertical plane.

11. The transceiver circuit of claim 3, comprising:
a semiconductor body comprising the first semiconductor portion, the second semiconductor portion and a substrate layer portion, and wherein the first semiconductor portion and the second semiconductor portion are formed side-by-side on a top surface of the substrate layer portion.

12. The transceiver circuit of claim 3, further comprising:
a carrier structure, wherein the transmitter component and the receiver component are arranged side-by-side on the carrier structure, and wherein the input terminal of the transmitter component and the output terminal of the receiver component include carrier terminals of the carrier structure.

13. The transceiver circuit of claim 3,
wherein the transmitter component and the receiver component are arranged side-by-side on a mounting surface of a carrier substrate, and wherein terminals of the transmitter component and terminals of the receiver component are in contact with carrier contact pads on the carrier substrate mounting surface.

14. A gate driver circuit, comprising:
the transceiver circuit of claim 3, wherein the driver-side interface circuit is configured to drive a gate signal for a power semiconductor switch.

15. The gate driver circuit of claim 14, wherein
the driver-side interface circuit comprises a push-pull inverter stage configured to drive a dynamic output current of at least 1 mA.

* * * * *

UNITED STATES PATENT AND TRADEMARK OFFICE
CERTIFICATE OF CORRECTION

| | | |
|---|---|---|
| PATENT NO. | : 11,791,536 B2 | |
| APPLICATION NO. | : 17/489661 | |
| DATED | : October 17, 2023 | |
| INVENTOR(S) | : W. Scherr et al. | |

It is certified that error appears in the above-identified patent and that said Letters Patent is hereby corrected as shown below:

In the Claims

Column 18, Line 58 (Claim 1, Line 13), please change "as radio" to -- as a radio --

Signed and Sealed this
Thirtieth Day of January, 2024

Katherine Kelly Vidal
*Director of the United States Patent and Trademark Office*